United States Patent
Bergman et al.

(10) Patent No.: US 11,901,225 B2
(45) Date of Patent: Feb. 13, 2024

(54) DIFFUSION LAYERS IN METAL INTERCONNECTS

(71) Applicant: Applied Materials, Inc., Santa Clara, CA (US)

(72) Inventors: Eric J. Bergman, Kalispell, MT (US); John L. Klocke, Kalispell, MT (US); Marvin L. Bernt, Kalispell, MT (US); Prayudi Lianto, Lorong G Telok Kurau (SG)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/474,394

(22) Filed: Sep. 14, 2021

(65) Prior Publication Data

US 2023/0077737 A1 Mar. 16, 2023

(51) Int. Cl.
*H01L 21/768* (2006.01)
*H01L 21/288* (2006.01)
*H01L 23/532* (2006.01)

(52) U.S. Cl.
CPC .... *H01L 21/76874* (2013.01); *H01L 21/2885* (2013.01); *H01L 21/76867* (2013.01); *H01L 23/53228* (2013.01); *H01L 21/76886* (2013.01)

(58) Field of Classification Search
CPC ........... H01L 21/76874; H01L 21/2885; H01L 21/76867
See application file for complete search history.

(56) References Cited

U.S. PATENT DOCUMENTS

| | | | |
|---|---|---|---|
| 4,204,031 A * | 5/1980 | Takemura | C22C 33/0257 427/295 |
| 2002/0127847 A1 | 9/2002 | Alling et al. | |
| 2004/0043159 A1 * | 3/2004 | Rzeznik | C23C 18/42 427/430.1 |
| 2005/0069646 A1 | 3/2005 | Inoue et al. | |
| 2005/0161338 A1 | 7/2005 | Fang et al. | |
| 2012/0263869 A1 | 10/2012 | Ivanov | |
| 2014/0264920 A1 * | 9/2014 | Yang | H01L 21/32134 438/658 |

FOREIGN PATENT DOCUMENTS

KR 20130040598 A 4/2013

OTHER PUBLICATIONS

Application No. PCT/US2022/043089, International Search Report and the Written Opinion, dated Jan. 4, 2023, 10 pages.

* cited by examiner

*Primary Examiner* — Thanhha S Pham
(74) *Attorney, Agent, or Firm* — Kilpatrick Townsend & Stockton LLP

(57) ABSTRACT

Exemplary methods of plating are described. The methods may include contacting a patterned substrate with a plating bath in a plating chamber. The patterned substrate includes at least one metal interconnect with a contact surface that is exposed to the plating bath. The metal interconnect is made of a first metal characterized by a first reduction potential. The methods further include plating a diffusion layer on the contact surface of the metal interconnect. The diffusion layer is made of a second metal characterized by a second reduction potential that is larger than the first reduction potential of the first metal in the metal interconnects. The plating bath also includes one or more ions of the second metal and a grain refining compound that reduces the formation of pinhole defects in the diffusion layer.

14 Claims, 5 Drawing Sheets

DIFFUSION LAYERS IN METAL INTERCONNECTS

TECHNICAL FIELD

The present technology relates to electroless plating operations in semiconductor processing. More specifically, the present technology relates to systems and methods that perform electroless plating of metal diffusion layers on surfaces of copper-containing interconnects in semiconductor structures and semiconductor packaging.

BACKGROUND

Integrated circuits are made possible by processes that produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

Electroless plating may be performed in a plating chamber with the target side of the wafer in contact with a liquid plating bath. Metal ions in the plating bath plate out on exposed metal surfaces that include a metal that has a lower reduction potential that the metal ions in the plating bath, creating a plated metal layer on the underlying metal surfaces. In many instances, the metal ions in the plating bath deposit around nucleation sites on the exposed metal surfaces and leave interstitial areas between the sites that have little or no plated metal. These variations in the amount of plated metal can challenge plating operations and create deposited metal layers with pinhole defects and excessive surface roughness, among other defects.

Thus, there is a need for improved systems and methods that can be used to produce high-quality devices and structures. These and other needs are addressed by the present technology.

SUMMARY

Embodiments of the present technology include plating methods that include contacting a patterned substrate with a plating bath in a plating chamber. The patterned substrate includes at least one metal interconnect with a contact surface that is exposed to the plating bath. The metal interconnect is made of a first metal characterized by a first reduction potential. The methods further include plating a diffusion layer on the contact surface of the metal interconnect. The diffusion layer is made of a second metal characterized by a second reduction potential that is larger than the first reduction potential of the first metal in the metal interconnects. The plating bath also includes one or more ions of the second metal and a grain refining compound that reduces the formation of pinhole defects in the diffusion layer.

In additional embodiments, the first metal in the at least one metal interconnect is copper. In further embodiments, the second metal in the diffusion layer is selected from the group consisting of silver, gold, platinum, palladium, and germanium. In still further embodiments, the grain refining compound includes glyoxylic acid or ethylene diamine tetraacetic acid. In yet additional embodiments, the grain refining compound is characterized by a concentration in the plating bath of less than or about 0.05 M. In more embodiments, the plating bath further includes at least one stabilizer compound such as imidazole or succinimide. In still more embodiments, the diffusion layer is plated on the contact surface of the metal interconnect by electroless plating. In yet further embodiments, the plating bath is characterized by a temperature of less than or about 25° C. during the plating of the diffusion layer.

Embodiments of the present technology also include plating methods that include contacting a patterned substrate with a plating bath in a plating chamber The patterned substrate includes at least one copper interconnect with a contact surface that is exposed to the plating bath. The methods further include plating a diffusion layer on the contact surface of the copper interconnect. The diffusion layer is made of silver. The plating bath is characterized by a temperature of less than or about 25° C. during the plating of the diffusion layer.

In additional embodiments, the plating bath is characterized by a concentration of silver ions that is less than or about 0.01 M. In further embodiments, the diffusion layer is plated on the contact surface of the copper interconnect at a rate of less than or about 1 nm/min. In still further embodiments, the diffusion layer is characterized by a thickness of less than or about 10 nm, and the diffusion layer is free of pinhole defects. In yet additional embodiments, the plating bath further includes a grain refining compound selected from the group consisting of glyoxylic acid and ethylene diamine tetraacetic acid. In more embodiments, the plating bath includes at least one stabilizer compound such as imidazole or succinimide.

Embodiments of the present technology further include integrated circuit devices. The devices include at least one copper column formed in a pattered structure. The devices also include a metal diffusion layer in contact with a top surface of the copper column. The metal diffusion layer is characterized by a thickness of less than or about 10 nm and is free of pinhole defects.

In additional embodiments, the metal diffusion layer in the integrated circuit devices may include a metal selected from the group consisting of silver, gold, platinum, palladium, and germanium. In further embodiments, the copper column includes copper characterized by a nanotwin crystal structure. In still further embodiments, the metal diffusion layer is characterized by an average surface roughness of less than or about 0.5 nm. In yet additional embodiments, the top surface of the copper column is characterized by a flat profile where a height difference between a center portion and a peripheral portion of the top surface is less than or about 1 nm. In more embodiments, the pattern substrate may include silicon.

Embodiments of the present technology permit the formation of diffusion layers on contact surfaces of metal interconnects. The diffusion layers increase the diffusion of copper across the contact surface during a bonding operation that joins opposite-facing portions of the interconnect into a single metal-to-metal interconnect. In embodiment, the diffusion layer is a thin layer of a metal that is electrolessly plated on the contact surface of one or both of the opposite-facing portions of the interconnect. The metal in the diffusion layer promotes the diffusion of the metal in the interconnect across the contact surface at lower temperatures, contact pressures, and times than required in a bonding operation without the diffusion layer. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
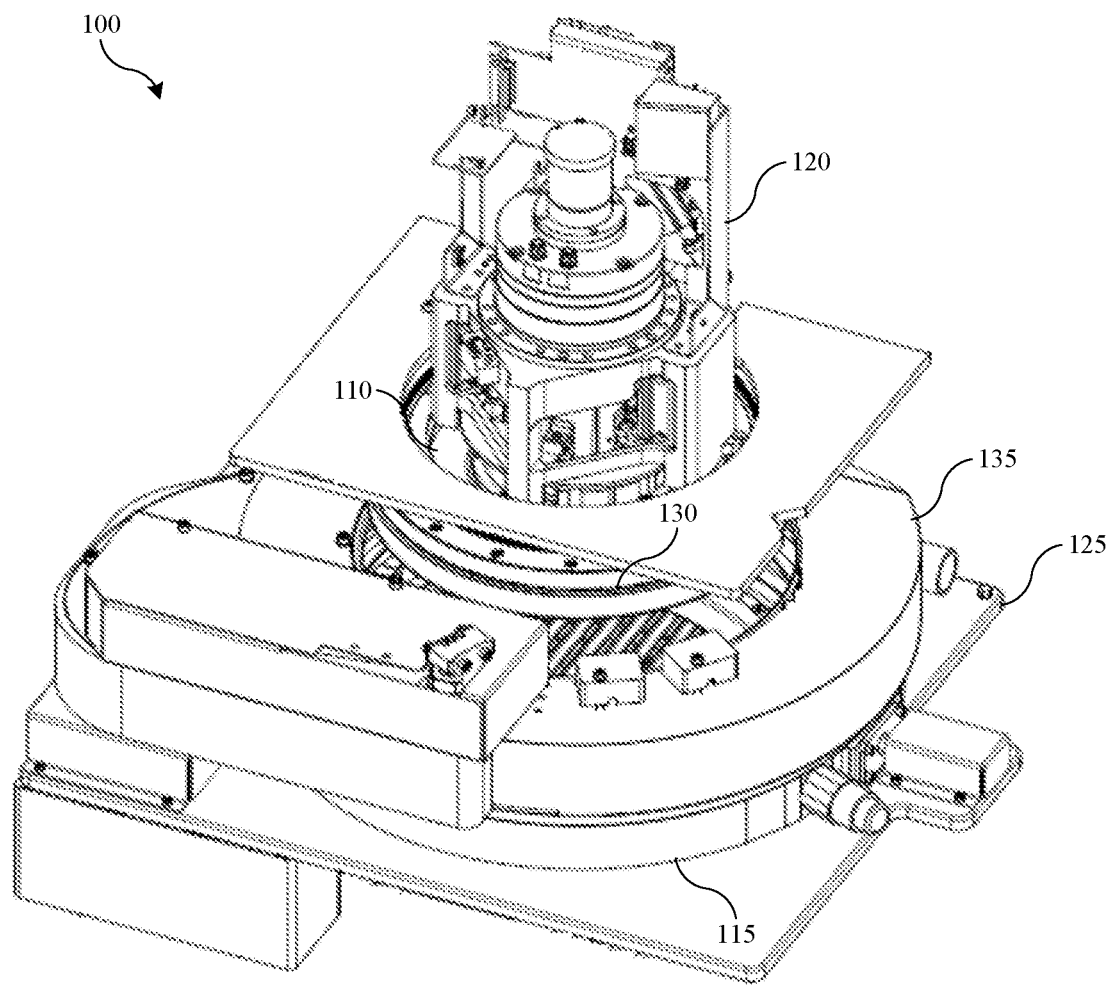
FIG. 1 shows a schematic perspective view of a plating system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Metal interconnects include the electrically-conductive lines, pillars, and columns that transmit electrical power and signals to and from the semiconductor substrates of integrated circuit devices. As the dimensions of the features in these devices continue to decrease, conventional processes of forming the interconnects with solder bumps is being replaced by direct bonding of interconnect ends. In many instances, this involves the direct bonding of interconnect contact surfaces made of copper at temperatures in excess of 250° C. For many types of integrated circuit devices these copper-to-copper bonding temperatures can exceed thermal budgets and increase the risk of device damage or performance degradation during interconnect formation.

One approach to lowering the thermal budget is to form a diffusion layer on one or both interconnect contact surfaces to increase the diffusion rate of the interconnect metal across the contact surface. When the interconnect metal is copper, the diffusion layer may be made of a different metal with a higher reduction potential such as silver, gold, platinum, palladium, and/or germanium. The diffusion layer increases reduces an activation barrier to copper diffusion across the contact surface, which facilitates the formation of a copper-to-copper bond at lower temperatures, pressures, and times than a conventional copper-to-copper interconnect bonding without the diffusion layer.

The diffusion layer formed on the contact surfaces is normally a thin layer that allows the rapid transfer of the interconnect metal across the contact surface. The layer is also smooth and free of spatial defects such as pits, hillocks, and pinholes that can reduce surface area contact between the opposite-facing contact surfaces. The layer is also localized over the surface of the interconnect to avoid unwanted electrical conduction pathways between adjacent interconnects.

Unfortunately, conventional methods of forming a diffusion layer involve a number of time-consuming patterning, deposition, and removal operations. These conventional operations include sputtering, physical vapor deposition, and atomic layer deposition of the diffusion layer on the contact surfaces of the interconnects. They normally include forming and patterning a mask layer on the patterned substrate that exposes the contact surfaces of the interconnects to the deposited metal of the diffusion layer. The as-deposited metal is then etched to remove the metal and masking materials from areas other than the contact surfaces, and polished to smooth and thin the metal formed on the contact surfaces.

The present technology replaces the multiple patterning, deposition, and removal operations with an electroless plating of the diffusion layer. Embodiments of the electroless plating process include contacting the patterned substrate with a plating bath that includes ions of the metal that form the diffusion layer. The metal ions are spontaneously reduced to deposited metal on the exposed contact surfaces of the metal interconnects. They do not reduce on the surfaces of the substrate material adjacent to the contact surfaces which eliminates the need to form a mask layer before the electroless deposition.

The present technology also includes compounds and conditions for the plating bath that facilitate the formation of a thin, smooth diffusion layer without then need for post deposition etching and polishing. In embodiments, the plating bath includes a grain refining compound that facilitates the migration of the plating metal across the contact surface of the interconnect. This prevents pinhole defects from forming in the areas between nucleation sites of the metal that is plating on the contact surface. It also evens out the heights of the plating metal on the contact surface to create a smooth top surface of the diffusion layer. In additional embodiments, the plating bath is set to a temperature less than or about 25° C. during the plating of the diffusion layer to reduce the deposition rate and provide a more even distribution of the depositing metal on the contact surface. Despite the low deposition rates, the thin diffusion layer may be plated onto the contact surface in less than or about 5 minutes.

FIG. 1 shows a schematic perspective view of a plating system 100 that can perform plating methods according to embodiments of the present technology. Plating system 100 is operable to perform both electroplating operations and electroless plating operations. In electroplating operations, the plating system 100 delivers an electric current to a substrate so that ions in an electroplating bath in contact with the substrate may be reduced and plated on the substrate. In electroless plating operations, the plating system 100 does not deliver an electric current to the substrate. Instead, the plating relies on the spontaneous reduction of ions in the plating bath when they contact surfaces of the substrate that include a material that has a lower standard electrode potential (E°) than the ions. Plating system 100 illustrates an exemplary plating system, including a system head 110 and a bowl 115. During plating operations, a wafer may be clamped to the system head 110, inverted, and extended into bowl 115 to perform a plating operation. Plating system 100 may include a head lifter 120, which may be configured to both raise and rotate the head 115, or otherwise position the head within the system, including tilting operations. The head and bowl may be attached to a deck plate 125 or other structure that may be part of a larger system incorporating multiple plating systems 100, and which may share electrolyte and other materials. A rotor may allow a substrate clamped to the head to be rotated within the bowl or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates a plating system 100 that may include components to be cleaned directly on the platform. In embodiments, the plating system 100 further includes an in situ rinse system 135 for component cleaning. In additional embodiments (not shown) a plating system may be configured with a platform on which the head may be moved to an additional module where a seal or other component cleaning is performed.

Figure 2:
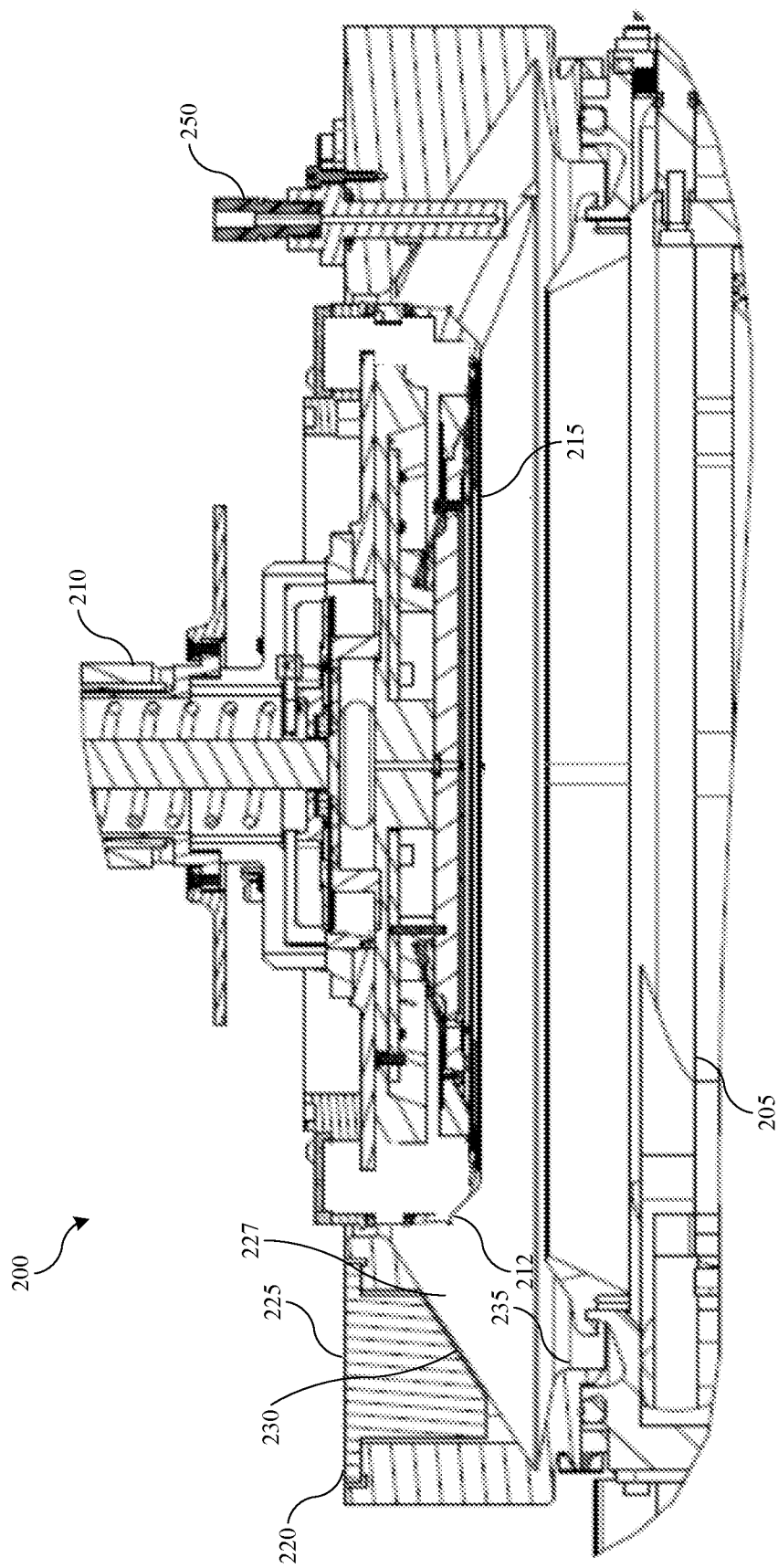
FIG. 2 shows a partial cross-sectional view of a plating system according to some embodiments of the present technology.

FIG. 2 shows a partial cross-sectional view of an plating chamber that includes an plating apparatus 200 according to some embodiments of the present technology. The plating apparatus 200 may be incorporated with a plating system, including system 100 described above. As illustrated in FIG. 2, a plating bath 205 of a plating system is shown along with a head 210 having a substrate 215 coupled with the head. In the embodiment shown, a substrate is coupled with a seal 212 incorporated on the head 210. A rinsing frame 220 may be coupled above the plating bath vessel 205 and may be configured to receive the head 210 into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230 and may be received in a plenum 235 extending about the rim for collection of the rinse fluid from the plating apparatus 200.

In embodiments, plating apparatus 200 may additionally include one or more cleaning components. The cleaning components may include one or more nozzles used to deliver fluids to or towards the substrate 215 or the head 210. FIG. 2 illustrates one of a variety of embodiments in which improved rinse assemblies may be used to protect the bath and substrate during rinsing operations. In additional embodiments, a side clean nozzle 250 may extend through the rim 225 of the rinsing frame 220 and be directed to rinse seal 212, along with aspects of substrate 215.

Figure 3:
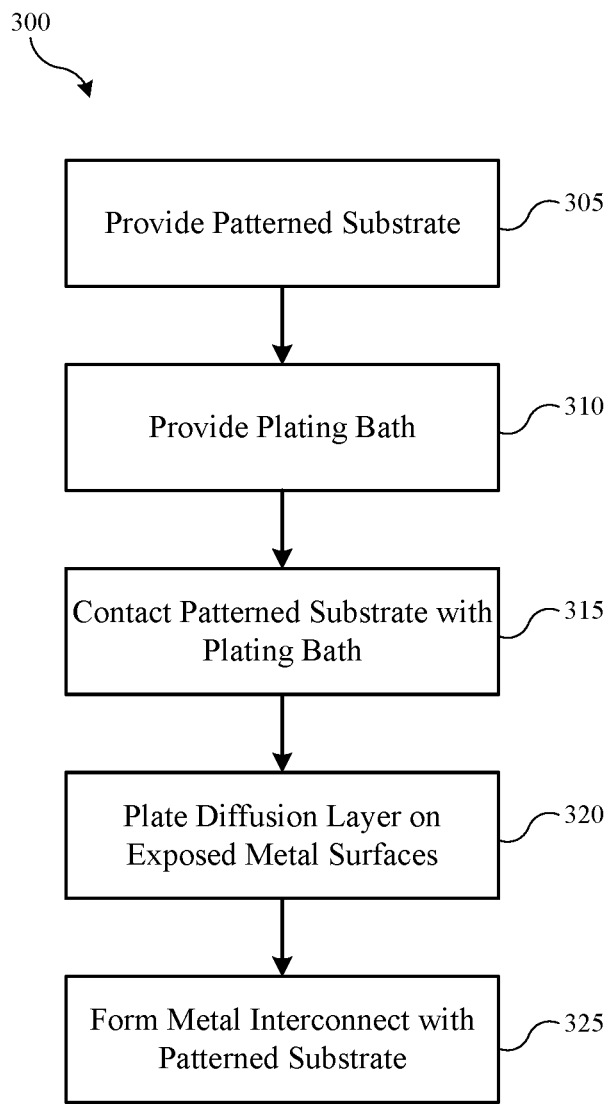
FIG. 3 shows exemplary operations in a method of plating a diffusion layer on contact surfaces of interconnects according to embodiments of the present technology.

Embodiments of the above-described systems and chambers may be used to perform embodiments of the present plating methods to form diffusion layers on contact surfaces of interconnects. FIG. 3 shows exemplary operations in a method 300 of plating a diffusion layer on contact surfaces of interconnects according to embodiments of the present technology. The method 300 may also include one or more operations prior to the initiation of the method, including front-end processing, deposition, gate formation, etching, polishing, cleaning, or any other operations that may be performed prior to the described operations. The method may further include a number of optional operations, which may or may not be specifically associated with some embodiments of methods according to the present technology. For example, many of the operations are described in order to provide a broader scope of the processes performed but are not critical to the technology or may be performed by alternative methodology, as will be discussed further below. Method 300 may describe operations shown schematically in FIGS. 4A-4B and FIGS. 5A-5B, the illustrations of which will be described in conjunction with the operations of method 300. It is to be understood that the figures illustrate only partial schematic views, and a substrate may contain any number of additional materials and features having a variety of characteristics and aspects, as illustrated in the figures. Embodiments of method 300 may or may not involve optional operations to develop an integrated circuit device to a particular fabrication operation.

Figure 4A:
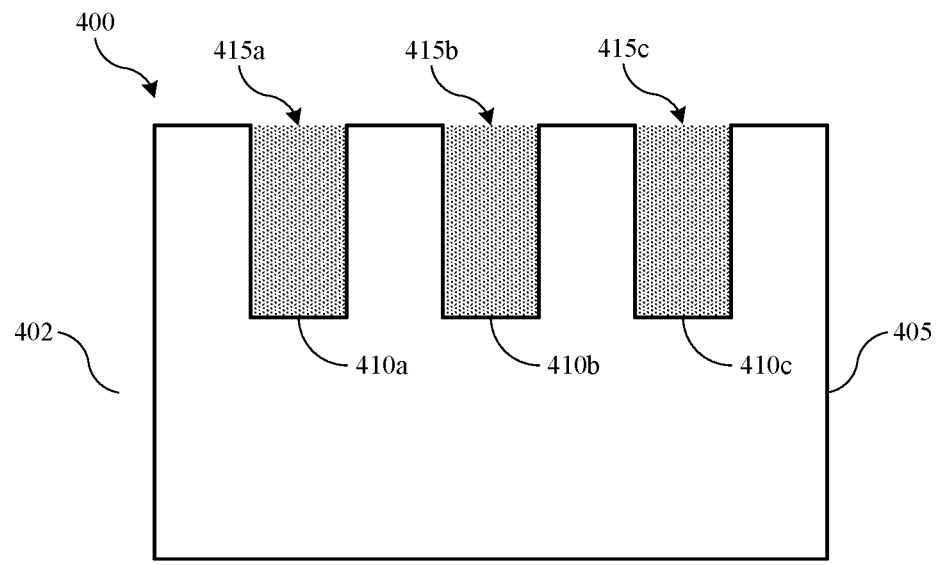
FIGS. 4A-B show schematic cross-sectional views of a patterned substrate undergoing a plating of diffusion layers on contact surfaces of interconnects according to embodiments of the present technology.

Embodiments of method 300 include providing a patterned substrate 400 in operation 305. FIG. 4A shows a portion of a patterned substrate 400 that may be included in, for example, an intermediate packaging region of a single-die or multi-die (e.g., 3D-IC) integrated circuit package. The portion of patterned substrate 400 may include interconnects 410a-c patterned into a substrate 405. In embodiments, the interconnects 410a-c may include a top surfaces 415a-c that form the contact surfaces for bonding the interconnects to other interconnect portions in an integrated circuit device. In additional embodiments, the interconnects 410a-c may be part of a redistribution line in an intermediate packaging region of an integrated circuit device. In further embodiments (not shown), the interconnects may extend through the substrate and terminate at an underlying conductive layer, such as a pad layer. In these embodiments, the underlying conductive layer forms the bottom surface of the interconnects instead of the substrate. These interconnects may include columnar vias and pillars that electrically connect metal lines and layers in vertically separated planes.

In embodiments, the interconnects 410a-c may be characterized by a pitch that is less than or about 100 µm, less than or about 75 µm, less than or about 50 µm, less than or about 40 µm, less than or about 30 µm, less than or about 20 µm, less than or about 10 µm, less than or about 5 µm, less than or about 4 µm, less than or about 3 µm, less than or about 2 µm, less than or about 1 µm, or less. In further embodiments, the interconnects 410a-c may be characterized by a height-to-width ratio (i.e., an aspect ratio) that is greater than or about 0.25:1, greater than or about 0.5:1, greater than or about 0.75:1, greater than or about 1:1, greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

In embodiments, the interconnects 410a-c may be made of an electrically conductive material such as copper, aluminum, or tungsten, among other electrically conductive materials. In further embodiments, the interconnects 410a-c may include copper characterized by a nanotwin crystal orientation (NTCu). In yet further embodiments, the top surfaces 415 a-c of the interconnects 410a-c may include NTCu over greater than or about 50% of the surface area, greater than or about 55% of the surface area, greater than or about 60% of the surface area, greater than or about 65% of the surface area, greater than or about 70% of the surface area, greater than or about 75% of the surface area, greater than or about 80% of the surface area, greater than or about 85% of the surface area, greater than or about 90% of the surface area, or more.

In additional embodiments, the top surfaces 415a-c of the interconnects 410a-c may be polished or otherwise treated following the formation of the interconnects. The polishing reduces the average surface roughness and removes surface contaminants from the top surfaces 415a-c. In more embodiments, polishing the top surfaces 415a-c may include chemical-mechanical-polishing (CMP) of the surfaces. In still more embodiments, polishing the contact surface may include electropolishing the surface by oxidizing and dissolving jagged portions of the surface in an electropolishing medium. In further embodiments, the polishing of the top surfaces 415a-c may include a combination of CMP and electropolishing. In yet further embodiments, the polished top surfaces 415a-c may decrease the average surface roughness of the as-deposited top surfaces by greater than or about 10%, greater than or about 20%, greater than or about 30%, greater than or about 40%, greater than or about 50%, or more. In still further embodiments, the polished top surfaces 415a-c may have an average surface roughness of less than or about 10 nm, less than or about 7.5 nm, less than or about 5 nm, less than or about 2.5 nm, less than or about 1 nm, or less.

In some embodiments, the polished top surfaces 415a-c may be characterized as having flat profiles where a height difference between the center portion and a peripheral portion of the top surfaces is less than or about 1 nm, less than or about 0.5 nm, less than or about 0.2 nm, or less. A flat profile for the top surfaces 415a-c increases the contact surface area when two opposite-facing contact surfaces are joined in an interconnect bonding operation. In additional embodiments, the polished top surfaces 415a-c may be characterized as having a concave profile where the height difference between the center portion and a peripheral portion of the top surfaces is greater than 1 nm, greater than or about 2 nm, greater than or about 3 nm, greater than or about 4 nm, greater than or about 5 nm, greater than or about 7.5 nm, greater than or about 10 nm, or more. These concave profiles may be formed by CMP operations that often leave a concave, dished surface that has a lower height in the center than on the periphery of the polished surface. In direct interconnect bonding operations, the concave surface can leave a gap in the middle of the interconnected ends. The gap can result in a smaller contact area between the opposite facing ends of the interconnect and reduced electrical conductivity through the interconnect structure. In embodiments of the present technology, the gap left by the polishing operation can be reduced or eliminated by forming a diffusion layer on the top surfaces 415a-c that creates a new top surface with a flatter profile than the polished top surfaces 415a-c.

Embodiments of method 300 further include providing a plating bath at operation 310. The compounds and conditions of the plating bath are selected to plate a thin diffusion layer on the top surfaces 415a-c of the interconnects 410 with a reduced amount of defects. The plating bath includes plating compounds that facilitate the plating of a diffusion layer on the top surfaces 415a-c of the interconnects 410. In embodiments, the plating bath may be an aqueous solution that includes ions of the material that make up the diffusion layer. In further embodiments, the ions may be metal ions of a metal that has higher electrode reduction potential (E than the metal incorporated into the top surfaces 415a-c of the interconnects 410. In still further embodiments where the metal incorporated into the top surfaces 415a-c includes copper, the metal ions in the plating bath may include one or more ions selected from silver ions, gold ions, platinum ions, palladium ions, and germanium ions, among other kinds of ions. In further embodiments, the ions may have a concentration in the plating bath of less than or about 0.01 M, less than or about 0.009 M, less than or about 0.008 M, less than or about 0.007 M, less than or about 0.006 M, less than or about 0.005 M, or less. The ion concentration is relatively dilute to maintain a low deposition rate of the diffusion layer material on the top surfaces 415a-c that can be stopped before the diffusion layer gets too thick. The low deposition rate also gives the plating diffusion layer more time to migrate from areas of high plating activity (e.g., nucleation sites on the top surfaces) to areas of lower plating activity.

In additional embodiments, the plating bath may include one or more grain refining compound that reduces the formation of pinhole defects in the diffusion layer formed on the top surfaces 415a-c. The grain refining compound facilitates the migration of the reduced material in the diffusion layer from regions of high deposition on the top surfaces 415a-c, such as nucleation regions, to regions of lower deposition, such as the interstitial regions between the nucleation regions. In embodiments, the grain refining compounds include glyoxylic acid and ethylene diamine tetraacetic acid, among other grain refining compounds. In further embodiments, the concentration of the grain refining compounds in the plating bath may be less than or about 0.1 M, less than or about 0.09 M, less than or about 0.08 M, less than or about 0.07 M, less than or about 0.06 M, less than or about 0.05 M, less than or about 0.04 M, less than or about 0.03 M, less than or about 0.02 M, less than or about 0.01 M, or less.

In yet additional embodiments, the plating bath may include one or more stabilizing compounds that facilitate the reduction of the ions in the plating bath to neutral elements and compound in the diffusion layer. In more embodiments, the stabilizing compounds may include imidazole and succimide, among other stabilizing compounds. In yet more embodiments, the concentration of the stabilizing compounds in the plating bath may be less than or about 0.1 M, less than or about 0.09 M, less than or about 0.08 M, less than or about 0.07 M, less than or about 0.06 M, less than or about 0.05 M, less than or about 0.04 M, less than or about 0.03 M, less than or about 0.02 M, less than or about 0.01 M, or less.

In still further embodiments, the plating bath may include one or more additional compounds to facilitate the plating of the diffusion layer on the top surfaces 415a-c of the interconnects 410. These additional compound may include thickening agents, surfactants, accelerators, levelers, suppressors, pH adjusters, and polarizers, among other compounds. The independent concentrations of these additional compounds in the plating bath may be less than or about 0.1 M, less than or about 0.09 M, less than or about 0.08 M, less than or about 0.07 M, less than or about 0.06 M, less than or about 0.05 M, less than or about 0.04 M, less than or about 0.03 M, less than or about 0.02 M, less than or about 0.01 M, or less. In embodiments, the plating bath may be characterized as a relatively dilute aqueous solution after the addition of all the plating compounds, and may be characterized by a pH at or near 7. In additional embodiments, the plating bath may be characterized by a pH greater than or about 5, greater than or about 6, greater than or about 7, greater than or about 8, or more. In further embodiments, the plating bath may be characterized by a pH less than or about 8, less than or about 7, less than or about 6 or less.

In still more embodiments, the plating bath may be characterized by a temperature at or near room temperature or less during the plating operation that forms the diffusion layer. The low temperature reduces the deposition rate for forming the thin diffusion layer on the top surfaces 415a-c of the interconnects 410. The reduced deposition rate is more easily stopped before the diffusion layer gets too thick, and also provides more time for the depositing metal to migrate from areas of high plating activity to areas of lower plating activity. In embodiments, the plating bath may be characterized by a temperature of less than or about 30° C., less than or about 25° C., less than or about 20° C., less than or about 15° C., less than or about 10° C., less than or about 5° C., or less.

Embodiments of method 300 also further include contacting the patterned substrate 400 with the plating bath at operation 315. In embodiments, the contact may occur when the patterned substrate 400 is placed in a bowl of the plating bath in plating system 100. In further embodiments, the plating bath may be in a non-agitated state during contact with the patterned substrate 400. In additional embodiments, one or both of the plating bath and the patterned substrate 400 may be in an agitated or turbulent state during contact and the formation of the diffusion layer. In further embodiments, agitating the plating bath helps initiate and maintain a uniform replenishment of reactive species, including ions of the diffusion layer material, at the deposition surface. In more embodiments, the agitation may be accomplished by spraying the plating bath onto and across the substrate surface as compared to immersing the substrate into a plating bath. In still more embodiments, the agitation and subsequent mass transport may be enhanced by rotating the patterned substrate while in contact with the plating bath. In yet embodiments, the agitation of the plating bath may be assisted by an agitating device, such as a paddle moving in a reciprocating direction while immersed in the plating bath and in proximity to the patterned substrate. In another embodiment, a combination of two or more of the listed techniques may be used to agitate the plating bath and further enhance mass transport and uniformity of the depositing diffusion layer. In further embodiments, the plating bath and the patterned substrate 400 may remain in continuous contact for the duration of the plating operation for the diffusion layer. In embodiments, the plating bath and patterned substrate 400 may remain in contact for less than or about 10 minutes, less than or about 9 minutes, less than or about 8 minutes, less than or about 7 minutes, less than or about 6 minutes, less than or about 5 minutes, less than or about 4 minutes, less than or about 3 minutes, less than or about 2 minutes, less than or about 1 minute, or less.

Embodiments of method 300 may still also include plating the diffusion layer on the contact surfaces of the interconnects at operation 320. The plating operation may be an electroless plating operation where electric power is not applied to the patterned substrate 400 during the plating of the diffusion layer. The metal ions in the plating bath spontaneously plate on the top surfaces of the interconnects due to differences in the standard electrode potentials of the metal ions in the plating bath and the reduced metal incorporated into the top surfaces of the interconnects. In some embodiments, electric power may be applied during a portion of the plating operation 320 to activate the plating or increase a plating rate of the diffusion layer. In these embodiments, the applied electric power may be characterized by an average current density of less than or about 0.5 mA/cm$^2$, less than or about 0.25 mA/cm$^2$, less than or about 0.1 mA/cm$^2$, or less.

Figure 4B:
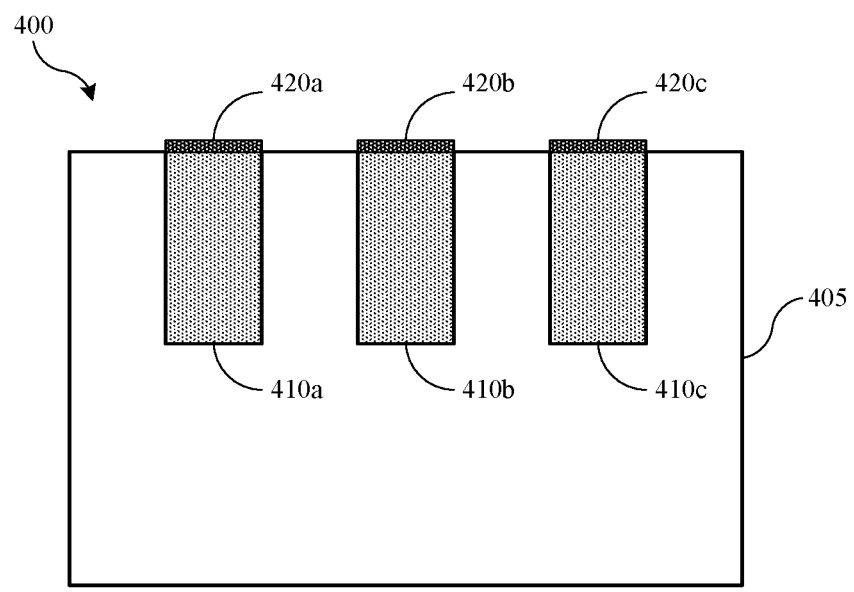

In the embodiment shown in FIG. 4B, a non-continuous diffusion layer 420a-c is formed on the top surfaces 415a-c of the interconnects 410a-c. In embodiments, the diffusion layer 420a-c is a thin layer of a metal that increases the diffusion rate of a different metal that is incorporated into the top surfaces 415a-c of the interconnects. In additional embodiments, the diffusion layer 420a-c may include a metal that is different from the metal in the top surfaces 415a-c of the interconnects 410a-c. In still additional embodiments, the diffusion layer may include a metal characterized by a standard electrode potential)(E° (i.e., the reduction potential) that is greater than the standard electrode potential of the metal in the top surfaces. In yet more embodiments, when the metal in the top surfaces 415a-c is copper, the diffusion layer 420a-c may include at least one metal chosen from silver, gold, platinum, palladium, and germanium. In further embodiments, the diffusion layer 420a-c may be characterized by a thickness of less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, or less. Thinner diffusion layers permit a more rapid migration of the interconnect metal across the contact surface to form a metal-to-metal bond with an opposite facing contact surface.

In embodiments, the thin diffusion layer 420a-c may be characterized by a small number of pinhole defects. In further embodiments, each portion of the diffusion layer 420a-c may include less than or about 5 pinhole defects, less than or about 4 pinhole defects, less than or about 3 pinhole defects, less than or about 2 pinhole defects, less than or about 1 pinhole defect, or no pinhole defects. As noted above the composition and conditions of the plating bath permits the formation of a thin diffusion layer with reduced numbers of spatial defects, including pinhole defects. These include embodiments of the plating bath that contains one or more grain refining compound that facilitates the migration of the depositing diffusion layer metal from areas with high plating rates to areas with lower plating rates. They also include embodiments where the concentration of the metal ions in the plating bath and the plating bath temperature are lowered to reduce the deposition rate of the diffusion layer materials. In further embodiments, the deposition rate of the diffusion layer material may be less than or about 5 nm/min, less than or about 4 nm/min, less than or about 3 nm/min, less than or about 2 nm/min, less than or about 1 nm/min, or less.

In additional embodiments, the diffusion layer 420a-c may form a new top contact surface of the interconnects that is characterized as smooth and flat. In further embodiments, the new top contact surface may have these smooth and flat characteristics as-deposited without requiring additional etching and polishing operations. In embodiments, the top contact surface of the diffusion layer may be characterized by an average surface roughness of less than or about 0.5 nm, less than or about 0.4 nm, less than or about 0.3 nm, less than or about 0.2 nm, less than or about 0.1 nm, or less. In further embodiments, the top contact surface of the diffusion layer may be characterized by a flat profile where the height difference between a center portion and a peripheral portion of the top contact surface is less than or about 2.5 nm, less than or about 2 nm, less than or about 1.5 nm, less than or about 1 nm, less than or about 0.5 nm, or less.

In further embodiments, the diffusion layer provides a number of enhancements to the metal-to-metal bonding between opposite-facing contact surfaces in a metal interconnect. These enhancements include an increase in the diffusivity of the interconnect metal across the contact surface interface to form a metal-to-metal bond in the interconnect. In embodiments, the diffusion layer increases the metal diffusivity of the interconnect metal at the contact surface by greater than or about 10%, greater than or about 25%, greater than or about 50%, greater than or about 75%, greater than or about 100%, or more. In embodiments where the interconnect metal is made of copper and the diffusion layer is made of silver, the surface diffusivity of the copper at 200° C. may be characterized as greater than or about $5 \times 10^{-6}$ cm$^2$/s, greater than or about $7.5 \times 10^{-6}$ cm$^2$/s, greater than or about $1 \times 10^{-5}$ cm$^2$/s, greater than or about $2.5 \times 10^{-5}$ cm$^2$/s, greater than or about $5 \times 10^{-5}$ cm$^2$/s, greater than or about $7.5 \times 10^{-5}$ cm$^2$/s, greater than or about $1 \times 10^{-4}$ cm$^2$/s, or more.

Embodiments of method 300 also further include forming a metal interconnect with a diffusion-layer-containing patterned substrate at operation 325. In the embodiments shown in FIG. 5A, a first patterned substrate 502, which includes first metal interconnects 510a-c patterned in a dielectric material, is positioned to be bonded with a second patterned substrate 504 having second metal interconnects 512a-c patterned in a dielectric material. In the embodiment shown, the contact surfaces 515a-c of the first metal interconnects 510a-c include the metal that makes the interconnects without a diffusion layer. On the other hand, a diffusion layer 525a-c is formed on the top contact surfaces of the second metal interconnects 512a-c to become the contact surface for interconnects.

In embodiments, operation 325 may include aligning the opposite-facing contact surfaces of the first and second metal interconnects and contacting them under temperature and pressure conditions that facilitate the bonding of the interconnects. The diffusion layer 525a-c facilitates this bonding by increasing the diffusivity rate of the interconnect metal across the interface of the contact surfaces. The increased diffusivity rate reduces the bonding temperature and pressure required to form a stable, bonded interconnect. In embodiments, the bonding operation may be characterized by a peak bonding temperature of less than or about 200° C., less than or about 190° C., less than or about 180° C., less than or about 170° C., less than or about 160° C., less than or about 150° C., less than or about 140° C., less than or about 130° C., less than or about 120° C., or less. In further embodiments, the bonding operation may be characterized by a peak bonding pressure of less than or about 15 MPa, less than or about 14 MPa, less than or about 13 MPa, less than or about 12 MPa, less than or about 11 MPa, less than or about 10 MPa, or less. In still further embodiments, the bonding operation may be characterized by a bonding time of less than or about 120 second, less than or about 100 seconds, less than or about 90 seconds, less than or about 75 seconds, less than or about 60 seconds, less than or about 45 seconds, less than or about 30 seconds, or less.

Figure 5A:
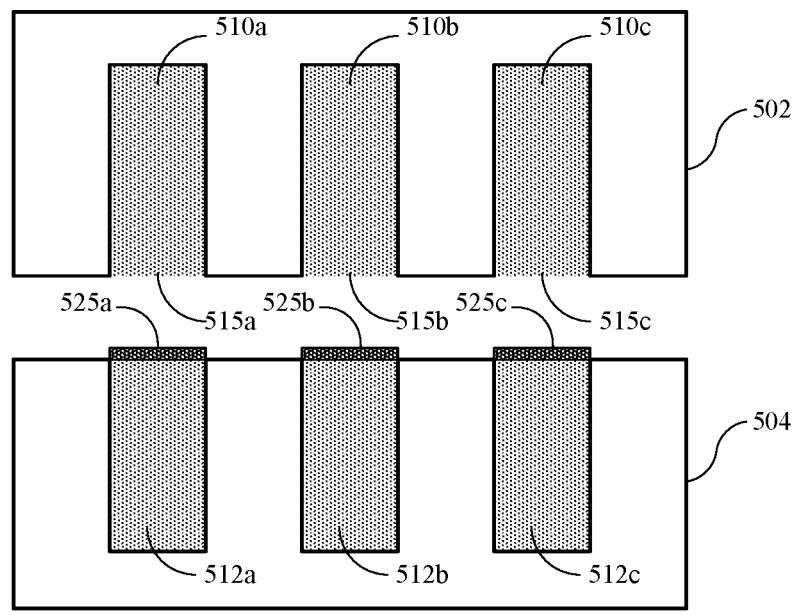
FIGS. 5A-B show schematic cross-sectional views of patterned substrates being joined by metal-to-metal interconnect bonding according to embodiments of the present technology.
Figure 5B:
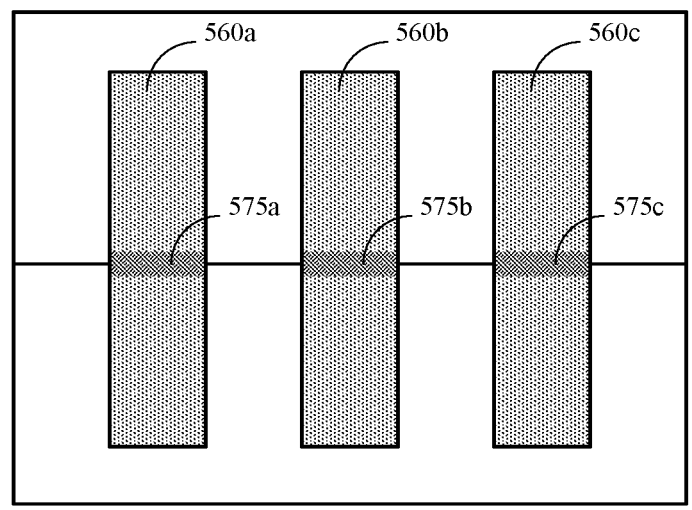

As shown in FIG. 5B, the bonded patterned substrates 550 may include bonded interconnects 560a-c that include alloyed areas 575a-c where the metal in the former diffusion layers 525a-c have intermixed with the metal in the interconnects. In embodiments, these alloyed areas 575a-c may be characterized by less sharply defined boundaries than the former diffusion layers 525a-c, and may be spread out over a greater thickness than the diffusion layers. In additional embodiments, the joined contact surfaces may leave no discernable seam after the bonding operation. In still further embodiments, the bonded contact surfaces may be characterized by an adhesion energy of greater than or about 1 GJ/m$^2$, greater than or about 2 GJ/m$^2$, greater than or about 3 GJ/m$^2$, greater than or about 4 GJ/m$^2$, greater than or about 5 GJ/m$^2$, or more. In yet more embodiments, the alloyed areas 575a-c have comparable electrical conduction characteristics as the bulk interconnects, and do not increase the resistance of the interconnect.

In embodiments, the bonded patterned substrates 550 may be part of many types of integrated circuit devices. These devices include single chip (i.e., die) packages, which are electronically interconnected through a circuit board, and multiple chips that are stacked or otherwise arrayed in a single package. In embodiments, the multiple-die packages can include dies for memory, logic, micro-electro-mechanical-systems (MEMS), and sensors, among other functions, and may include system-on-chip (SoC) and system-in-package (SiP) packages. As these multiple-chip packages add more chips that are further miniaturizing, the density of the electrical interconnections (i.e., the interconnect density) between them increases. This has caused the size of those interconnections to decrease. These sizes, commonly measured as the pitch of an electrically-conductive line or via that makes an interconnection between input/output pads on adjacent semiconductor dies, have decreased from several hundred micrometers to 10 µm or less. Embodiments of the present technology such as bonded patterned substrates 550 can accommodate the reduced interconnect dimensions.

Embodiments of the present technology provide contact surfaces that include a diffusion layer for a variety of integrated circuit structures, including high-density interconnect lines, vias, and pillars, among other kinds of metal-containing IC structures for IC devices. The embodiments address the problems of forming metal interconnects at low bonding temperatures, pressures, and times by incorporating a diffusion layer into the contact surfaces of the interconnects. The diffusion layer includes one or more metals that increase the diffusivity of the interconnect metal across the contact surfaces of the interconnect to form a strong metal-to-metal interconnect bond at more mild bonding conditions. These and other embodiments of the present technology provide metal-to-metal contact surfaces with improved binding effectiveness over conventional contact surfaces that lack a diffusion layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the period of time" includes reference to one or more periods of time and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A plating method comprising:
   contacting a patterned substrate with a plating bath in a plating chamber, wherein the pattern substrate comprises at least one metal interconnect with a contact surface that is exposed to the plating bath, and wherein the metal interconnect is made of a first metal characterized by a first reduction potential; and
   plating a diffusion layer on the contact surface of the metal interconnect, wherein the diffusion layer is made of a second metal characterized by a second reduction potential that is larger than the first reduction potential of the first metal in the at least one metal interconnect, wherein the plating bath comprises one or more ions of the second metal and a grain refining compound that reduces the formation of pinhole defects in the diffusion layer, the grain refining compound is characterized by a concentration in the plating bath of less than or about 0.05 M, and wherein the diffusion layer is plated on the contact surface of the metal interconnect at a rate of less than or about 5 nm/min.

2. The plating method of claim 1, wherein the first metal in the at least one metal interconnect is copper.

3. The plating method of claim 1, wherein the second metal in the diffusion layer is selected from the group consisting of silver, gold, platinum, palladium, and germanium.

4. The plating method of claim 1, wherein the grain refining compound comprises glyoxylic acid or ethylene diamine tetraacetic acid.

5. The plating method of claim 1, wherein the plating bath further comprises at least one stabilizer compound comprising imidazole or succinimide.

6. The plating method of claim 1, wherein the diffusion layer is plated on the contact surface of the metal interconnect by electroless plating.

7. The plating method of claim 1, wherein the plating bath is characterized by a temperature of less than or about 25° C. during the plating of the diffusion layer.

8. The plating method of claim 1, wherein the plating bath is characterized by a temperature of less than or about 5° C. during the plating of the diffusion layer.

9. The plating method of claim 1, wherein the plating bath is characterized by a concentration of one or more ions of the second metal that is less than or about 0.01 M.

10. A plating method comprising:
    contacting a patterned substrate with a plating bath in a plating chamber, the pattern substrate comprises at least one copper interconnect with a contact surface that is exposed to the plating bath; and
    plating a diffusion layer on the contact surface of the copper interconnect, wherein the diffusion layer is made of silver, and
    wherein the plating bath is characterized by a temperature of less than or about 5° C. during the plating of the diffusion layer, and wherein the plating bath is characterized by a concentration of silver ions that is less than or about 0.01 M.

11. The plating method of claim 10, wherein the diffusion layer is plated on the contact surface of the copper interconnect at a rate of less than or about 1 nm/min.

12. The plating method of claim 10, wherein the diffusion layer is characterized by a thickness of less than or about 10 nm, and wherein the diffusion layer is free of pinhole defects.

13. The plating method of claim 10, wherein the plating bath further comprises a grain refining compound selected from the group consisting of glyoxylic acid and ethylene diamine tetraacetic acid.

14. The plating method of claim 10, wherein the plating bath further comprises at least one stabilizer compound comprising imidazole or succinimide.

* * * * *